US010460666B2

(12) United States Patent
Kim

(10) Patent No.: US 10,460,666 B2
(45) Date of Patent: Oct. 29, 2019

(54) ORGANIC LIGHT-EMITTING DIODE DISPLAY DEVICE AND METHOD OF DRIVING THE SAME

(71) Applicant: LG DISPLAY CO., LTD., Seoul (KR)

(72) Inventor: Jung-Jae Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 33 days.

(21) Appl. No.: 15/839,052

(22) Filed: Dec. 12, 2017

(65) Prior Publication Data

US 2018/0190198 A1 Jul. 5, 2018

(30) Foreign Application Priority Data

Dec. 29, 2016 (KR) ........................ 10-2016-0182306

(51) Int. Cl.

| | |
|---|---|
| ***H01L 29/08*** | (2006.01) |
| ***G09G 3/3258*** | (2016.01) |
| ***G09G 3/3233*** | (2016.01) |
| ***G09G 3/3291*** | (2016.01) |
| ***G09G 3/3266*** | (2016.01) |

(52) U.S. Cl.

CPC ......... *G09G 3/3258* (2013.01); *G09G 3/3233* (2013.01); *G09G 3/3266* (2013.01); *G09G 3/3291* (2013.01); *G09G 2300/0861* (2013.01); *G09G 2310/0251* (2013.01); *G09G 2310/0262* (2013.01); *G09G 2320/0295* (2013.01); *G09G 2320/043* (2013.01)

(58) Field of Classification Search

CPC .................................................... G09G 3/3258
USPC ........................................................... 257/40
See application file for complete search history.

(56) References Cited

U.S. PATENT DOCUMENTS

2011/0157134 A1* 6/2011 Ogura ...................... G09G 3/20 345/211
2013/0093800 A1* 4/2013 Shim .................... G09G 3/3233 345/690
2016/0163255 A1* 6/2016 Kim ..................... G09G 3/2003 345/212

* cited by examiner

*Primary Examiner* — Ajay Arora
(74) *Attorney, Agent, or Firm* — Birch, Stewart, Kolasch & Birch, LLP

(57) ABSTRACT

An organic light-emitting diode (OLED) display device can include a pixel and a data driver. The pixel includes a driving thin film transistor (TFT) to drive an OLED element, a first switching TFT to connect a data line to a gate electrode of the driving TFT, a second switching TFT to connect a reference line to a source electrode of the driving TFT and a capacitor connected between the gate electrode and the source electrode of the driving TFT. The data driver includes a first amplifier to drive the data line with a reference voltage or a data voltage, a second amplifier to drive the reference line with an initialization voltage, and a third amplifier to sense a voltage of the reference line and supply a reference sensing voltage to the second amplifier, in which the reference line voltage is based on a threshold voltage of the driving TFT.

12 Claims, 7 Drawing Sheets

ORGANIC LIGHT-EMITTING DIODE DISPLAY DEVICE AND METHOD OF DRIVING THE SAME

CROSS-REFERENCE TO RELATED APPLICATIONS

This application claims the benefit of Republic of Korea Patent Application No. 10-2016-0182306, filed in the Republic of Korea on Dec. 29, 2016, which is hereby incorporated by reference in its entirety.

BACKGROUND OF THE INVENTION

Field of the Invention

The present invention relates to an organic light-emitting diode display device capable of simplifying the configuration of an external compensation circuit for compensating for a threshold voltage of a driving transistor on a real-time basis and a method of driving the same.

Discussion of the Related Art

A representative flat panel display device for displaying images using digital data includes a liquid crystal display (LCD) using liquid crystal, an organic light-emitting diode (OLED) display device using OLEDs, and an electrophoretic display (EPD) using electrophoretic particles.

Thereamong, the OLED display device is a self-luminescent device which causes an organic light-emitting layer to emit light through recombination of electrons and holes and is expected to be a next-generation display device due to its high luminance, low driving voltage, and ultra-thin film thickness.

Each of a plurality of pixels constituting the OLED display device includes an OLED element and a pixel circuit for driving the OLED element. The pixel circuit includes a switching thin film transistor (TFT) for transferring a data voltage to a storage capacitor and a driving TFT for controlling current according to a voltage charged in the storage capacitor to supply the current to the OLED element. The OLED element generates light proportional to a current value.

The OLED display device is nonuniform in a threshold voltage of a driving TFT per pixel and driving characteristics of the driving TFT according to process deviations, driving environment, driving time, and differences in a driving current with respect to the same voltage, so that a nonuniform luminance phenomenon may occur. To solve this problem, the OLED display device additionally performs an external compensation operation for sensing driving characteristics of each driving TFT and compensating for the sensed result.

For example, the OLED display device performs the external compensation operation in a manufacturing process and a real-time driving process to sense the driving characteristics of each driving TFT, in order to determine compensation values for compensating for characteristic deviations of the driving TFTs based on sensing information, and store the compensation values in a memory. The OLED display device compensates for data which is to be supplied to each subpixel using the compensation values stored in the memory and drives each subpixel using the compensated data, thereby displaying images.

For this reason, an OLED display device having a conventional external compensation function requires additional time for performing the external compensation operation during the manufacturing process and real-time driving, and additionally requires a sensing circuit, an operation circuit for acquiring the compensation values and the memory for storing the compensation values, thereby causing time loss and increasing cost of circuit components.

SUMMARY OF THE INVENTION

Accordingly, the present invention is directed to an OLED display device and a method of driving the same that substantially obviates one or more problems due to limitations and disadvantages of the related art.

An object of the present invention is to provide an OLED display device capable of simplifying the configuration of an external compensation circuit for compensating for a threshold voltage of a driving TFT on a real-time basis and a method of driving the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting diode (OLED) display device includes a pixel including a driving thin film transistor (TFT) configured to drive an OLED element, a first switching TFT configured to connect a data line to a gate electrode of the driving TFT by control of a first gate line, a second switching TFT configured to connect a reference line to a source electrode of the driving TFT by control of a second gate line, and a capacitor connected between the gate electrode and source electrode of the driving TFT DT. The OLED display device includes a data driver including a first amplifier configured to drive the data line, a second amplifier configured to drive the reference line, and a third amplifier configured to sense a voltage of the reference line in which a threshold voltage of the driving TFT is reflected and supply a reference sensing voltage to the second amplifier.

Each frame for driving the pixel can include a scan period during which the first and second switching TFTs are turned on and a target driving voltage corresponding to a data voltage is charged in the capacitor, and a light-emitting period during which the first and second switching TFTs are turned off and the driving TFT drives the OLED element by the target driving voltage charged in the capacitor. The scan period can include an initialization period, a sensing period, and a sampling period.

In another aspect of the present invention, a method of driving an OLED display device includes, during an initialization period, supplying a reference voltage to a gate electrode of a driving TFT and charging an initialization voltage in a source electrode of the driving TFT, during a sensing period, driving the driving TFT by a difference voltage between the reference voltage and the initialization voltage and charging a reference voltage in which a threshold voltage of the driving TFT is reflected in the source electrode of the driving TFT, and during a sampling period, supplying a data voltage to the gate electrode of the driving TFT, sensing the reference voltage in which the threshold voltage is reflected through the source electrode of the driving TFT, and supplying the sensed reference sensing voltage to the source electrode of the driving TFT.

During the initialization period, a first amplifier can supply the reference voltage to the gate electrode of the driving TFT via a data line and a first switching TFT, and a second amplifier can supply the initialization voltage to the source electrode of the driving TFT via a reference line and a second switching TFT.

During the sensing period, the first amplifier can supply the reference voltage to the gate electrode of the driving TFT via the data line and the first switching TFT, the second amplifier can become a high impedance state, and a threshold voltage-reduced reference voltage can be charged in the source electrode of the driving TFT and the reference line by driving of the driving TFT.

During the sampling period, the first amplifier can supply the data voltage to the gate electrode of the driving TFT via the data line and the first switching TFT, the third amplifier can sense the threshold voltage-reduced reference voltage of the reference line as the reference sensing voltage and supply the reference sensing voltage to the second amplifier, the second amplifier can supply the reference sensing voltage supplied from the third amplifier to the source electrode of the driving TFT via the reference line and the second switching TFT, and the capacitor can store a difference voltage between the data voltage and the reference sensing voltage as a target driving voltage.

Both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

Figure 1:
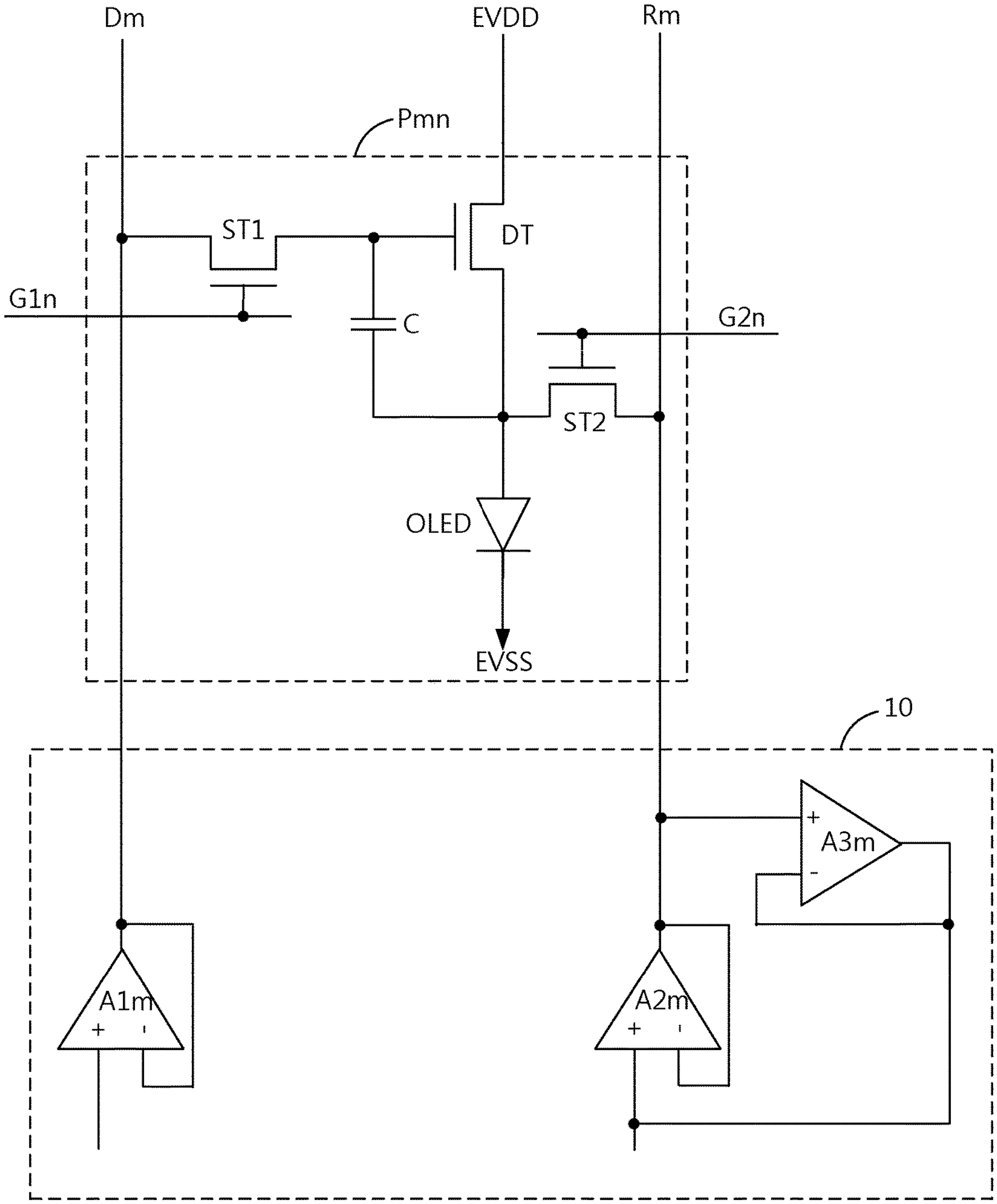
FIG. 1 is a circuit diagram illustrating a partial configuration of one pixel circuit and a data driver connected to the pixel circuit which represent an OLED display device according to an embodiment of the present invention.
Figure 2:
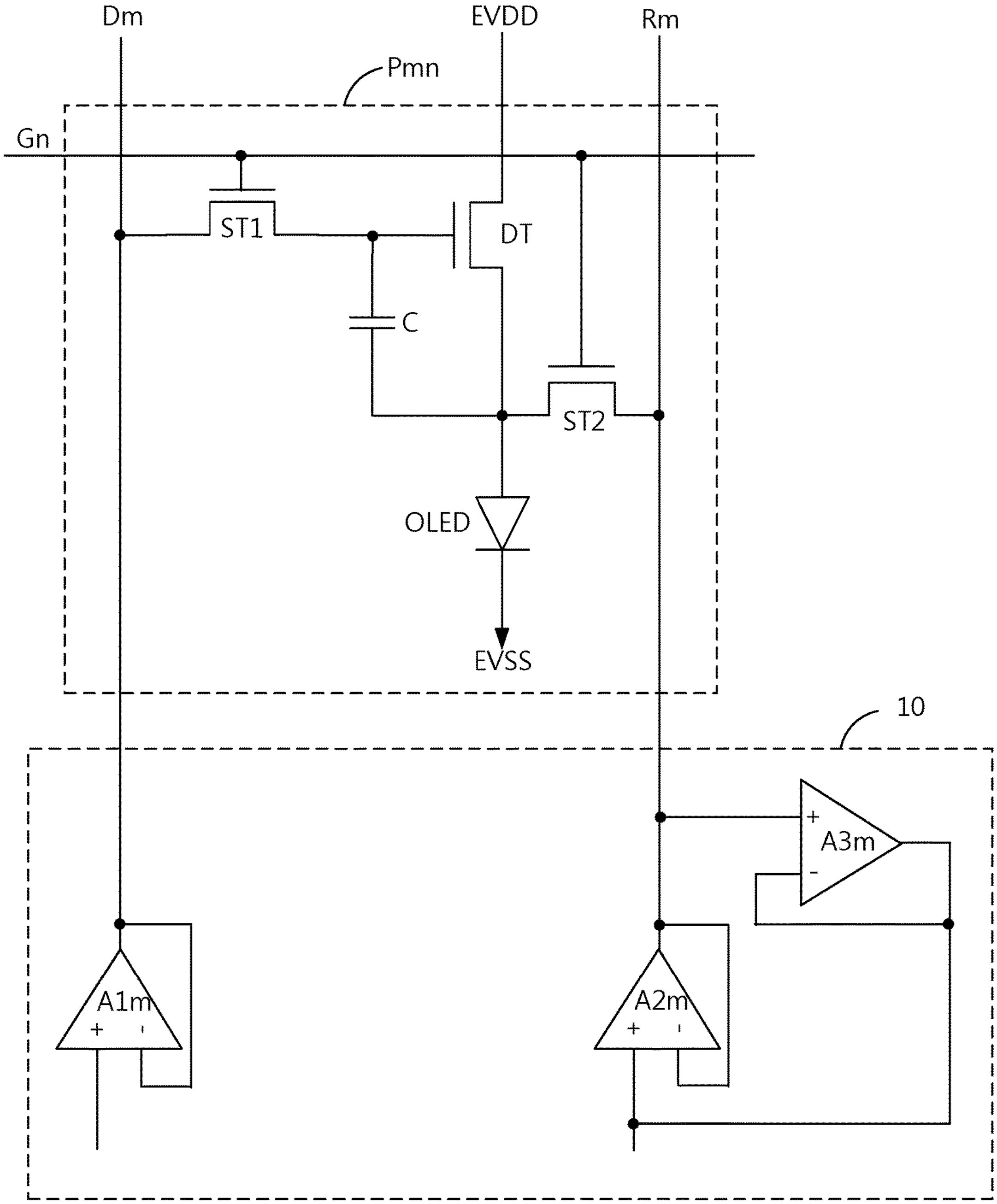
FIG. 2 is a circuit diagram illustrating a partial configuration of one pixel circuit and a data driver connected to the pixel circuit which represent an OLED display device according to another embodiment of the present invention.
Figure 3:
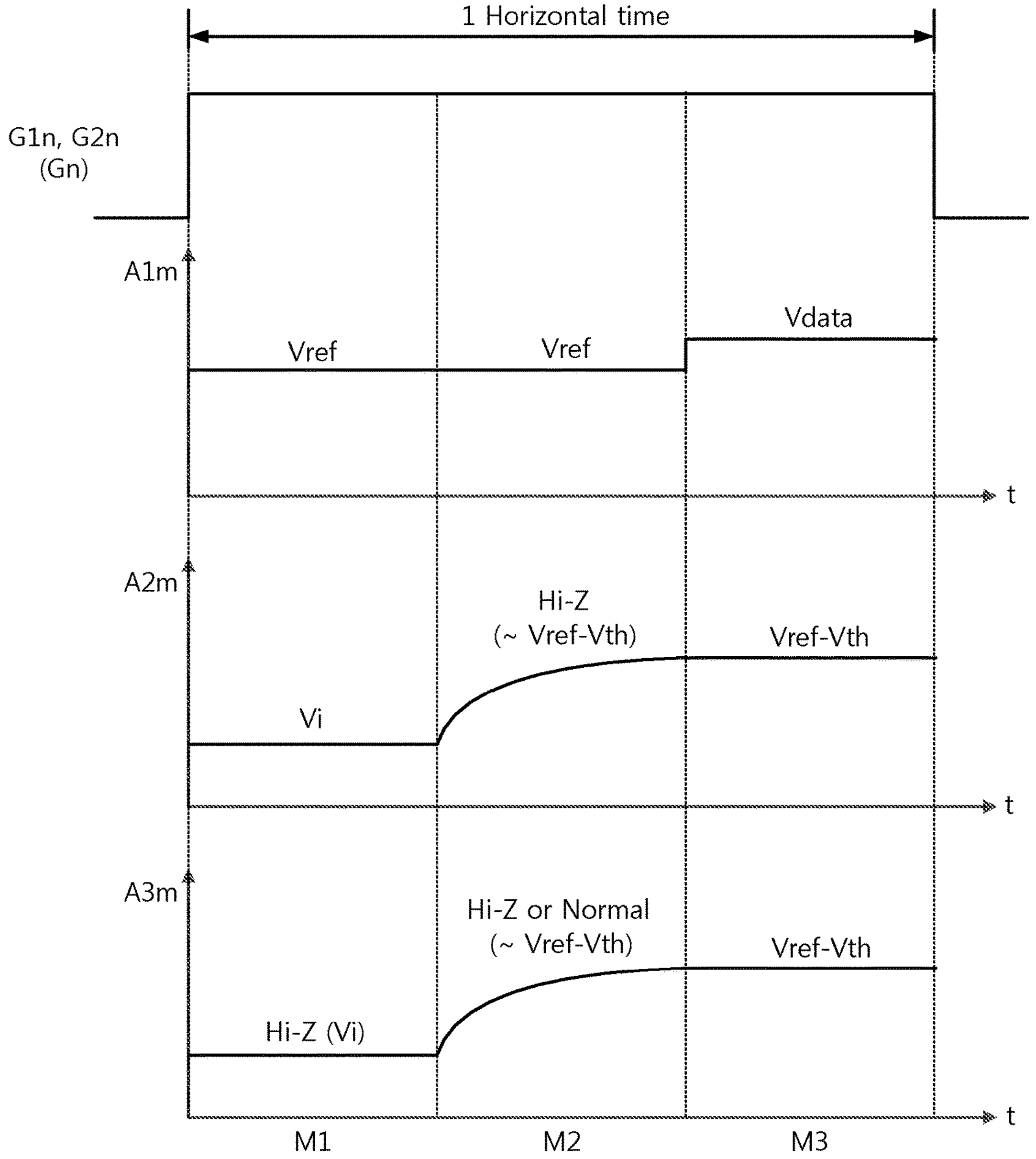
FIG. 3 is a waveform chart illustrating output voltages of first to third amplifiers according to an embodiment of the present invention.

FIG. 1 is a circuit diagram illustrating a partial configuration of an OLED display device according to an embodiment of the present invention, FIG. 2 is a circuit diagram illustrating a partial configuration of an OLED display device according to another embodiment of the present invention, and FIG. 3 is a waveform chart of a data driver according to an embodiment of the present invention.

Referring to FIGS. 1 and 2, a pixel Pmn representatively shows an (m, n)-th pixel structure in an m-th pixel column (where m is a natural number) and an n-th pixel row (where n is a natural number), among a plurality of pixels configured in the form of a matrix in a display panel.

In FIGS. 1 and 2, a data driver 10 includes a first amplifier A1*m* for driving an m-th data line Dm among amplifiers for individually driving data lines of the display panel, a second amplifier A2*m* for driving an m-th reference line Rm among amplifiers for individually driving reference lines of the display panel, and a third amplifier A3*m* for sensing the m-th reference line among amplifiers for individually sensing the reference lines.

The pixel Pmn includes an OLED element, a driving thin film transmission (TFT) DT for driving the OLED element, a first switching TFT ST1 for connecting the data line Dm to a gate electrode of the driving TFT DT, a second switching TFT ST2 for connecting the reference line Rm to a source electrode of the driving TFT DT, and a capacitor C connected between the gate electrode and source electrode of the driving TFT DT.

Amorphous silicon (a-Si) TFTs, polycrystalline silicon (poly-Si) TFTs, oxide TFTs, or organic TFTs can be used as the switching TFTs ST1 and ST2 and the driving TFT DT.

The driving TFT DT is connected between a first power (hereinafter, EVDD) line and an anode of the OLED element to supply current provided from the EVDD line to the OLED element as a driving current according to a driving voltage Vgs stored in the capacitor C.

The OLED element includes the anode connected to the source electrode of the driving TFT DT, a cathode connected to a second power line (hereinafter, EVSS), and an organic light-emitting layer connected between the anode and the cathode. Although the anode is independently formed with respect to each pixel, the cathode can be commonly shared by pixels. If the driving current is supplied to the OLED element, electrons and holes are injected from the cathode and the anode, respectively, into the organic light-emitting layer of the OLED element and recombine in the organic light-emitting layer to emit light of fluorescent or phosphorescent materials, which is proportional to a current value of the driving current.

Referring to FIG. 1, the first switching TFT ST1 can be controlled by a first gate line G1*n* of the n-th pixel row and the second switching TFT ST2 can be controlled by a second gate line G2*n* of the n-th pixel row.

Alternatively, as illustrated in FIG. 2, the first switching TFT ST1 and the second switching TFT ST2 can be controlled by one gate line Gn of the n-th pixel row.

The first switching TFT ST1 is turned on during a scan period of the n-th pixel row to thereby connect the data line Dm to the gate electrode of the driving TFT DT. The second switching TFT ST2 is turned on during the scan period of the n-th pixel row to thereby connect the reference line Rm to the source electrode of the driving TFT DT. Each scan period includes, as illustrated in FIG. 3, an initialization period M1, a sensing period M2, and a sampling period M3.

The first and second switching TFTs ST1 and ST2 are turned off during a light-emitting period.

During the initialization period M1 and the sensing period M2, the first switching TFT ST1 supplies a reference voltage Vref supplied to the data line Dm to the gate electrode of the driving TFT. During the sampling period M3, the first switching TFT ST1 supplies a data voltage Vdata supplied to the data line Dm to the gate electrode of the driving TFT DT.

During the initialization period M1, the second switching TFT ST2 supplies an initialization voltage Vi supplied to the reference line Rm to the source electrode of the driving TFT DT. During the sensing period M2, the second switching TFT ST2 supplies a threshold voltage (Vth)-reflected reference voltage Vref−Vth in the source electrode of the driving TFT DT to the reference line Rm. During the sampling period, the second switching TFT ST2 supplies the Vth-compensated reference voltage Vref−Vth supplied to the reference line Rm, that is, the difference voltage Vref−Vth between the reference voltage and the threshold voltage, to the source electrode of the driving TFT DT.

The capacitor C connected between the gate electrode and source electrode of the driving TFT DT stores the driving voltage Vgs of the driving TFT DT. The capacitor C senses and stores Vth of the driving TFT DT during the sensing period M2 of the pixel Pmn, stores a difference voltage Vdata−Vref+Vth between the data voltage Vdata and the Vth-reflected voltage Vref−Vth during the sampling period M3 as the driving voltage Vgs, and maintains the driving voltage Vgs during the light-emitting period to cause the driving TFT DT to supply a constant target current.

The data driver 10 includes the first amplifier A1*m* for driving the data line Dm. A non-inverting input terminal (+) of the first amplifier A1*m* is connected to an input line from which the reference voltage Vref and the data voltage Vdata are alternately supplied and an inverting input terminal (−) of the first amplifier A1*m* is connected to an output terminal as a feedback structure to serve as an output buffer. The first amplifier A1*m* buffers the reference voltage Vref and the data voltage Vdata which are sequentially supplied to the non-inverting input terminal (+) during each horizontal period and sequentially supplies the buffered reference voltage Vref and data voltage Vdata to the data line Dm. The data driver 10 converts digital pixel data into the analog data voltage Vdata. The data driver 10 supplies the reference voltage Vref to the input terminal of the first amplifier A1*m* during the initialization period M1 and the sensing period M2 of each horizontal period, and the first amplifier A1*m* buffers the reference voltage Vref and supplies the buffered reference voltage Vref to the data line Dm. The data driver 10 supplies the data voltage Vdata to the input terminal of the first amplifier A1*m* during the next sampling period M3 of the sensing period M2 of each horizontal period and the first amplifier A1*m* buffers the data voltage Vdata and supplies the buffered data voltage Vdata to the data line Dm.

The data driver 10 includes an external analog compensator having the second amplifier A2*m* for driving the reference line Rm and the third amplifier A3*m* for sensing the voltage of the reference line Rm, which are configured as a feedback structure. The third amplifier A3*m* senses the voltage of the reference line Rm and supplies the sensed voltage to the second amplifier A2*m*, and then the second amplifier A2*m* drives the reference line Rm by the sensed voltage of the reference line Rm.

A non-inverting input terminal (+) of the second amplifier A2*m* is connected to an input line to which the initialization voltage Vi is supplied and to an output terminal of the third amplifier A3*m* and an inverting terminal (−) of the second amplifier A2*m* is connected to an output terminal of the second amplifier A2*m* as a feedback structure. A non-inverting input terminal (+) of the third amplifier A3*m* is connected to the reference line Rm and an inverting input terminal (−) of the third amplifier A3*m* is connected to an output terminal of the third amplifier A3*m* as a feedback structure. The output terminal of the third amplifier A3*m* is connected to the non-inverting input terminal + of the second amplifier A2*m*.

The second amplifier A2*m* supplies the initialization voltage Vi to the reference line Rm during the initialization period M1 of each horizontal period, enters a high impedance Hi-Z state during the sensing period M2, and supplies a voltage Vref−Vth of the reference line Rm sensed through the third amplifier A3*m* to the reference line Rm during the sampling period M3. The third amplifier A3*m* enters the high impedance Hi-Z state during the initialization period of each horizontal period and enters the high impedance Hi-Z state or a normal driving state during the sensing period M2. During the sampling period M3, the third amplifier A3*m* senses the voltage Vref−Vth of the reference line Rm and supplies the sensed voltage Vref−Vth to the input terminal of the second amplifier A2*m*.

Figure 4:
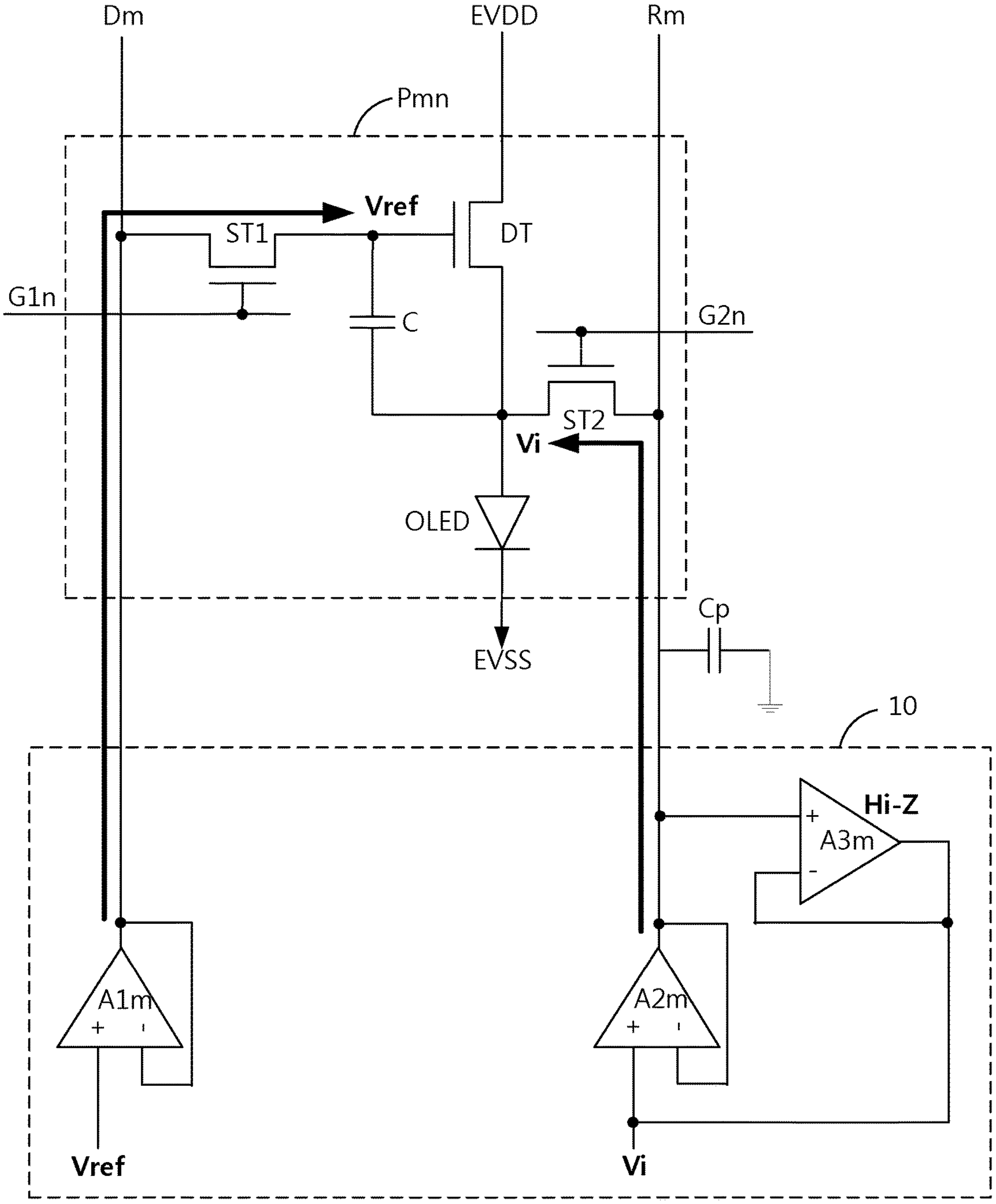
FIG. 4 is a diagram illustrating an operation of an initialization period of a pixel and a data driver according to an embodiment of the present invention.
Figure 5:
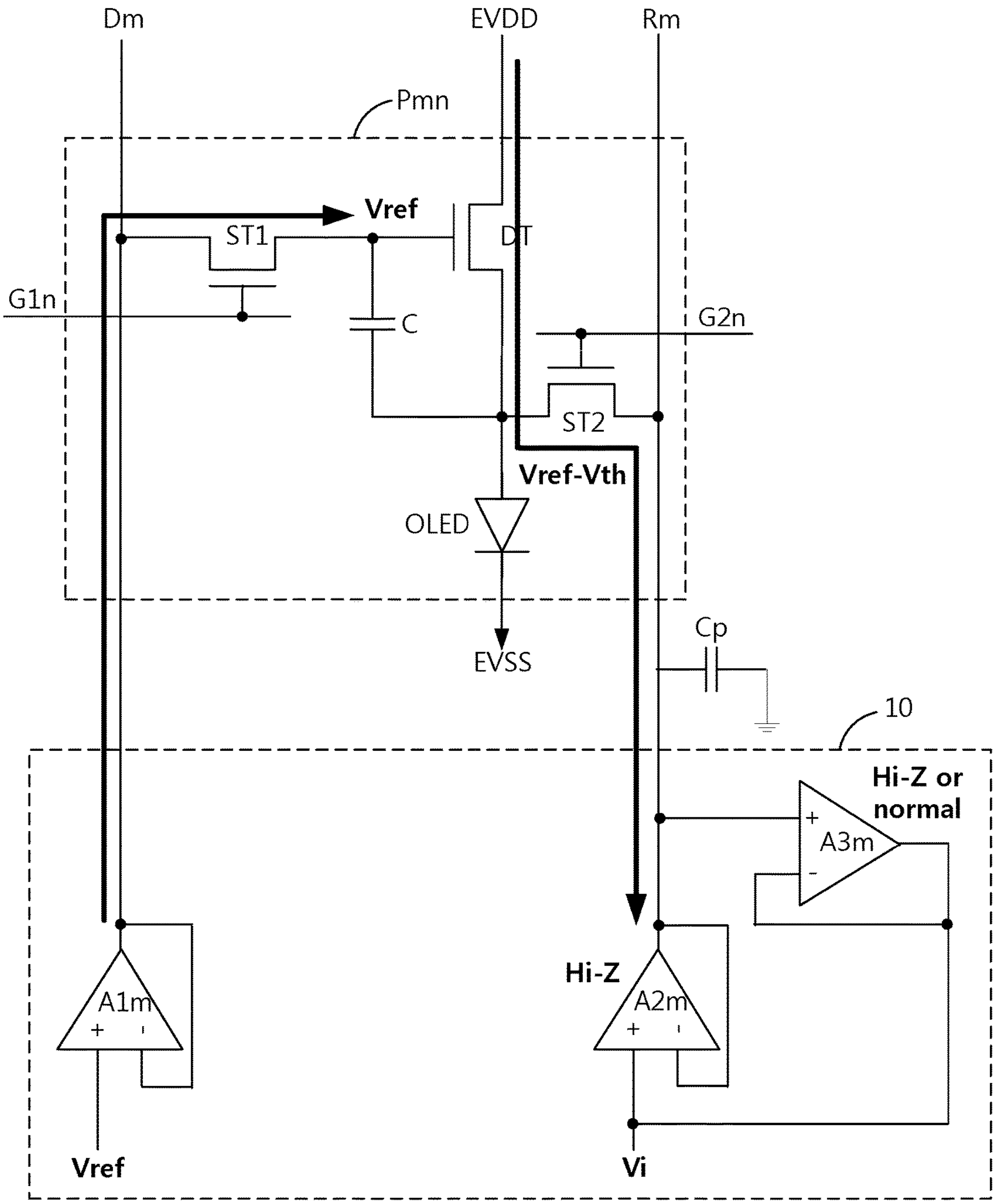
FIG. 5 is a diagram illustrating an operation of a sensing period of a pixel and a data driver according to an embodiment of the present invention.
Figure 6:
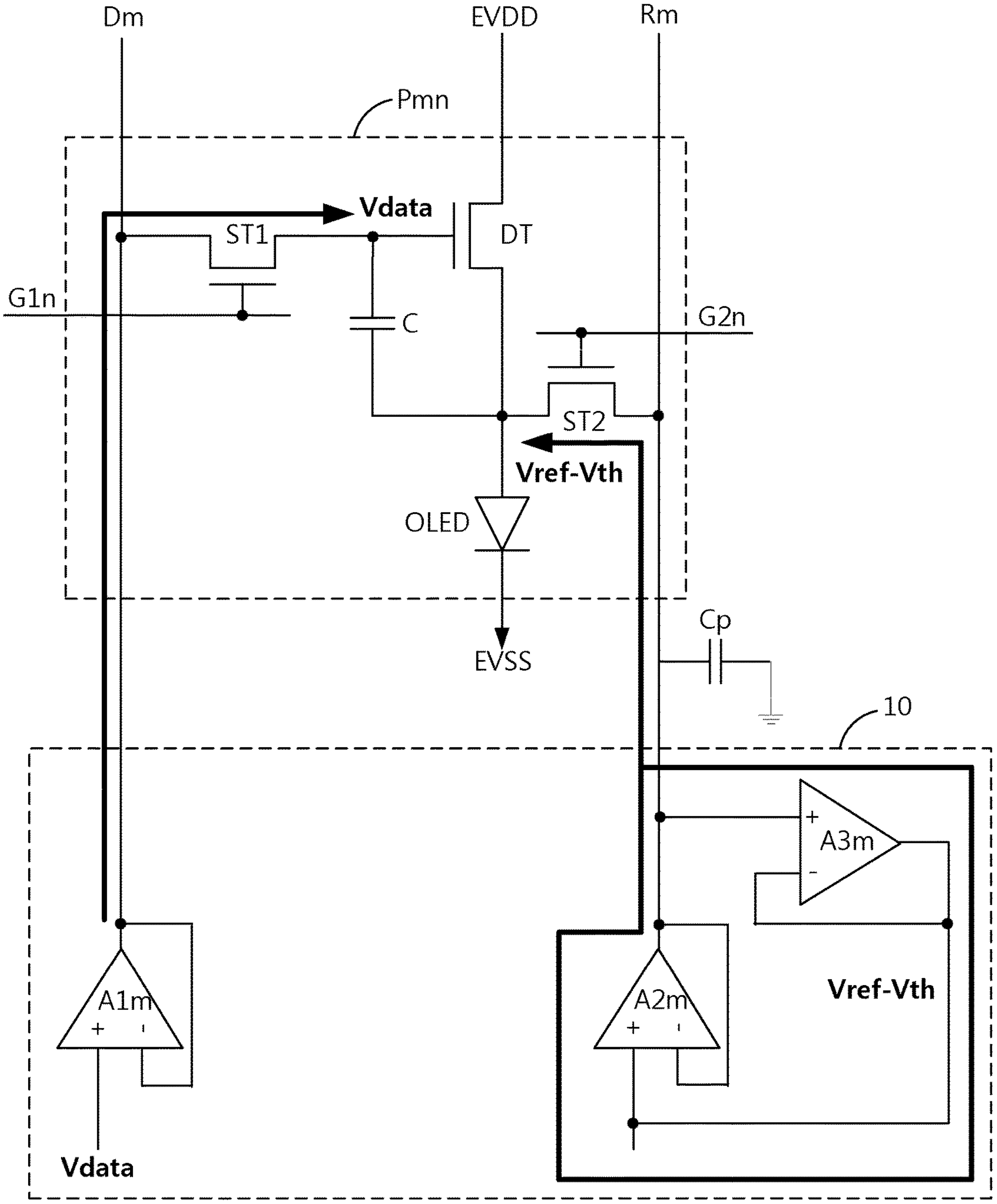
FIG. 6 is a diagram illustrating an operation of a sampling period of a pixel and a data driver according to an embodiment of the present invention.

FIGS. 4 to 6 are diagrams sequentially illustrating an operation process during a scan period of any one pixel according to an embodiment of the present invention. The operation process will now be described with reference to the waveforms of the data driver shown in FIG. 3 as well.

Referring to FIGS. 3 and 4, during the initialization period M1 of each scan period, the first amplifier A1*m* supplies the reference voltage Vref to the data line Dm and the second amplifier A2*m* supplies the initialization voltage Vi to the reference line Rm. In this instance, the third amplifier A3*m* enters a high impedance Hi-Z state and thus does not perform a buffering operation. The first switching TFT ST1 transfers the reference voltage Vref supplied to the data line Dm to the gate electrode of the driving TFT DT to initialize the gate electrode of the driving TFT DT to the reference voltage Vref and the second switching TFT ST2 transfers the initialization voltage Vi supplied to the reference line Rm to the source electrode of the driving TFT DT to initialize the source electrode of the driving TFT DT to the initialization voltage Vi. For example, during the initialization period M1, Vg of the driving TFT DT is set to Vref, and Vs of the driving TFT DT is set to Vi, while the third amplifier A3*m* is turned off and the second amplifier A2*m* is on to provide Vi.

Then, the capacitor C charges a difference voltage Vref-Vi between the reference voltage Vref and the initialization voltage Vi supplied respectively to the gate electrode and the source electrode of the driving TFT DT (e.g., Vref is on the top plate of the capacitor and Vi is on the bottom plate of the capacitor). During the initialization period M1, the reference voltage Vref and the initialization voltage Vi are set such that the difference voltage Vref-Vi charged in the capacitor C is greater than Vth of the driving TFT DT. That is, the initialization voltage Vi of the reference line Rm is set to be less than "Vref−Vth" and to be less than a threshold voltage (Vth) of the OLED element. The threshold voltages Vth are values determined during panel design and therefore are predictable. Since the difference voltage Vref-Vi charged in the capacitor C is greater than Vth of the driving TFT DT, the driving TFT DT is driven. However, since the initialization voltage Vi is less than Vth of the OLED element, the OLED element does not emit light. For example, the voltages are set such that Vth of the OLED is less than the difference voltage Vref−Vi charged in the capacitor C, which is less than of Vth of the TFT (e.g., OLED Vth>Vref−Vi>TFT Vth).

Referring to FIGS. 3 and 5, during the sensing period M2, the first amplifier A1*m* continues to supply the reference voltage Vref through the data line Dm and the first switching TFT ST1, and the second amplifier A2*m* enters a high impedance Hi-Z state and does not output the initialization voltage Vi to the reference line Rm. In this instance, the third amplifier A3*m* can operate in the high impedance Hi-Z state or a normal state to serve as a buffer (e.g., a voltage follower with unity gain). The third amplifier A3*m* which operates in the normal state can buffer a voltage charged in the reference line Rm and supply the buffered voltage to the input terminal of the second amplifier A2*m* which is in the high impedance Hi-Z state.

During this sensing period M2, the driving TFT DT is driven by the voltage Vref-Vi charged in the capacitor C until the driving TFT DT enters a saturation state, e.g., until a voltage difference between both terminals of the capacitor C becomes Vth. For example, during the sensing period M2, the driving TFT DT stays on and the current has nowhere to go except to the bottom plate of the capacitor C, so the voltage on the bottom plate of the capacitor changes from Vin to Vref−Vth. Then, since Vs of the driving TFT is set to the voltage at the bottom plate of the capacitor C, the voltage of the source electrode (Vs) of the driving TFT DT is raised from the initialization voltage Vi to a Vth-reflected voltage of Vref−Vth, e.g., a Vth-reduced reference voltage Vref−Vth and, in the same manner as the source electrode of the driving TFT, the Vth-reduced reference voltage Vref−Vth is charged in the reference line Rm through the second switching TFT ST2. During this sensing period M2, as illustrated as voltage waveforms in FIG. 3, the voltage of the output terminal of the second amplifier A2*m* is in a high impedance Hi-Z state and the voltage of the output terminal of the third amplifier A3*m* is gradually raised from the initialization voltage Vi to the Vth-reflected reference voltage Vref−Vth in the same manner as the reference line Rm. For example, during the sensing period M2, Vg of the driving TFT DT is set to Vref, Vs of the driving TFT DT is set to Vref−Vth, and Vgs of the driving TFT DT is set to Vref−(Vref−Vth) and Vgs of the driving TFT DT becomes set to Vth. As a result, the third amplifier A3*m* can sense the Vth-reflected voltage Vref−Vth charged in the reference line Rm. During the sensing period M2, since the voltage Vref−Vth charged in the source electrode of the driving TFT DT is less than Vth of the OLED element, the OLED element does not emit light.

Referring to FIGS. 3 and 6, during the sampling period M3, the first amplifier A1*m* transfers the data voltage Vdata to the data line Dm, the third amplifier A3*m* senses the voltage Vref−Vth charged in the reference line Rm and supplies the sensed voltage to the input terminal of the second amplifier A2*m*, and the second amplifier A2*m* buffers the reference sensing voltage Vref−Vth, e.g., the Vth-reduced reference voltage Vref−Vth, supplied from the third amplifier A3*m* and supplies the buffered voltage (e.g., Vref−Vth) to the reference line Rm.

Then, the first switching TFT ST1 supplies the data voltage Vdata supplied to the data line Dm to the gate electrode of the driving TFT DT and the switching TFT ST2 supplies the reference sensing voltage Vref−Vth supplied to the reference line Rm to the source electrode of the driving TFT DT. Therefore, the capacitor C stores a difference voltage Vdata−Vref+Vth between the data voltage Vdata and the reference sensing voltage Vref−Vth, e.g., a Vth-compensated driving voltage Vgs=(Vdata−Vref+Vth). For example, during the sampling period M3, Vgs of the driving TFT DT is set to (Vdata−(Vref−Vth)). By the driving voltage Vgs=(Vdata−Vref+Vth) stored in the capacitor C, the driving TFT DT can generate a constant target current I_oled determined by the difference voltage Vdata−Vref between the data voltage Vdata and the reference voltage Vref, regardless of Vth, as indicated by Equation 1 and supply the target current I_oled to the OLED element.

$$I\_oled=K(Vgs-Vth)^2=K(Vdata-Vref+Vth-Vth)^2=K(Vdata-Vref)^2 \quad \text{Equation 1:}$$

After the sampling period M3, during the light-emitting period during which the first and second switching TFTs ST1 and ST2 are turned off, the driving TFT DT supplies the constant target current I_oled to the OLED element by the driving voltage Vgs maintained in the capacitor C, thereby causing the OLED element to emit light.

In this way, the OLED device according to an embodiment can supply a uniform target current regardless of a characteristic deviation of the driving TFT DT and thus a nonuniform luminance phenomenon caused by the characteristic deviation of the driving TFT DT between pixels can be prevented.

Figure 7:
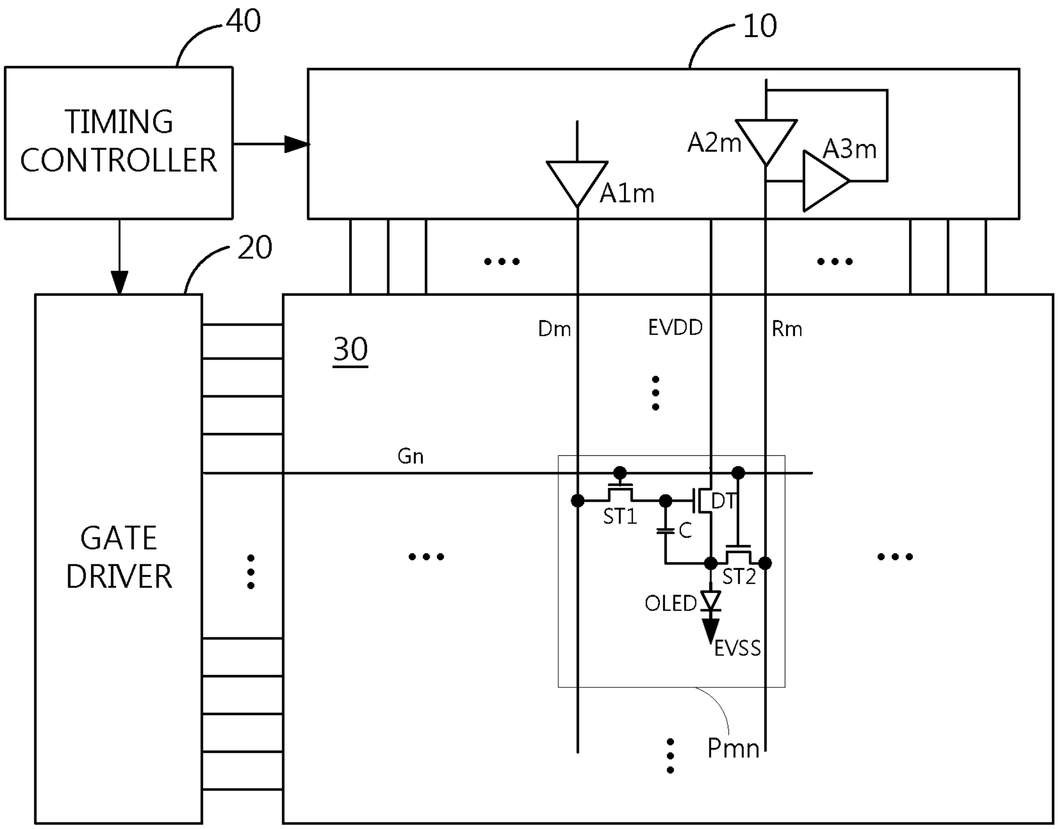
FIG. 7 is a block diagram schematically illustrating the configuration of an OLED display device according to an embodiment of the present invention.

FIG. 7 is a block diagram schematically illustrating the configuration of an OLED display device according to an embodiment of the present invention.

Referring to FIG. 7, the OLED display device includes a timing controller 40, a data driver 10, a gate driver 20, and a display panel 30.

The display panel 30 displays an image through a pixel array having pixels arranged in the form of a matrix. A basic pixel of the pixel array can be configured by at least three subpixels W/R/G, B/W/R, G/B/W, R/G/B, or W/R/G/B which can express white through color mixture of white (W), red (R), green (G), and blue (B) subpixels. Each pixel P includes, as in an embodiment illustrated in FIGS. 1 and 2, the OLED element, and the pixel circuit including the driving TFT DT for independently driving the OLED element, the first and second switching TFTs ST1 and ST2, and the capacitor C.

The timing controller 40 performs image processing, such as compensation of picture quality or reduction of dissipated power, on input image data and outputs the image-processed data to the data driver 10. The timing controller 40 generates a data control signal for controlling a driving timing of the data driver 10 and a gate control signal for controlling a driving timing of the gate driver 20, using input timing control signals, and outputs the data control signal and the gate control signal to the data driver 10 and the gate driver 20, respectively.

The gate driver 20 drives a plurality of gate lines of the display panel 30 using the gate control signal supplied from the timing controller 40. The gate driver 20 supplies a scan pulse of a gate-ON voltage during a scan period and a gate-OFF voltage during the other periods, to each gate line in response to the gate control signal.

The data driver 10 receives the data control signal and image data from the timing controller 40 and receives a reference voltage Vref and an initialization voltage Vi from a power supply. The data driver 10 is driven by the data control signal, segments a reference gamma voltage set supplied from a gamma voltage generator into gray-level voltages corresponding to gray-level values of data, and then converts digital image data into an analog data voltage Vdata using the segmented gray-level voltages.

As described above, the data driver 10 sequentially supplies the reference voltage Vref and the data voltage Vdata to each data line Dm using the first amplifier A1*m* during every one horizontal scan period. The external analog compensator included in the data driver 10 supplies the initialization voltage Vi to each reference line Rm using the second amplifier A2*m* during every scan period, senses, through each reference line Rm, a Vth-reflected reference voltage Vref−Vth of the driving TFT DT of a corresponding pixel Pmn using the third amplifier A3*m*, and then supplies the sensed reference voltage Vref−Vth to the pixel Pmn through each reference line Rm using the second amplifier A2*m*.

Thus, the driving TFT DT of each pixel Pmn can generate a constant target current I_oled determined by a difference voltage Vdata−Vref between the data voltage Vdata and the reference voltage Vref, irrespective of Vth, and supply the target current I_oled to the OLED element.

In this way, since the OLED display device according to an embodiment can supply the constant target current to the OLED element regardless of a characteristic deviation of the driving TFT DT, a nonuniform luminance phenomenon caused by the characteristic deviation of the driving TFT DT between pixels can be prevented.

In the OLED display device according to an embodiment and the method of driving the same, an external analog compensator in which an amplifier for driving a reference line and an amplifier for sensing the reference line are configured as a feedback structure can be used to sense a Vth-reflected reference voltage of a driving TFT from each pixel and again supply the sensed reference voltage to each pixel during a sampling period. Then, since each pixel can drive an OLED element by a uniform driving current using a Vth-compensated target driving voltage Vgs of the driving TFT, a luminance nonuniform phenomenon caused by a Vth deviation of the driving TFT can be prevented and uniform luminance can be realized.

As a result, the OLED display device according to an embodiment and the method of driving the same can reduce manufacturing costs by omitting an external compensation operation during a manufacturing process, prevent time loss by omitting the external compensation operation even during real-time driving, and reduce the number of circuit components and reduce an area occupied by a circuit and remarkably reduce circuit costs because external compensation circuits such as a sensing circuit and an operation circuit for obtaining compensation values and a memory for storing the compensation values are unnecessary.

It will be apparent to those skilled in the art that various modifications and variations can be made in the present invention without departing from the spirit or scope of the invention. Thus, the present invention is intended to cover the modifications and variations of this invention within the scope of the appended claims and their equivalents.

What is claimed is:

1. An organic light-emitting diode (OLED) display device, comprising:
- a pixel including:
  - a driving thin film transistor (TFT) configured to drive an OLED element;
  - a first switching TFT configured to connect a data line to a gate electrode of the driving TFT by control of a first gate line;
  - a second switching TFT configured to connect a reference line to a source electrode of the driving TFT by control of a second gate line; and
  - a capacitor connected between the gate electrode of the driving TFT and the source electrode of the driving TFT; and
- a data driver including:
  - a first amplifier configured to drive the data line with a reference voltage (Vref) or a data voltage (Vdata);
  - a second amplifier configured to drive the reference line with an initialization voltage; and
  - a third amplifier configured to sense a voltage of the reference line, and supply a reference sensing voltage to the second amplifier, wherein the voltage of the reference line is based on a threshold voltage (Vth) of the driving TFT.

2. The OLED display device according to claim 1, wherein the reference sensing voltage is set to the reference voltage (Vref) minus the threshold voltage (Vth) of the driving TFT.

3. The OLED display device according to claim 1, wherein an output terminal of the second amplifier is connected to the reference line, a non-inverting input terminal of the second amplifier is connected to an output terminal of the third amplifier and an inverting input terminal of the second amplifier is connected to the output terminal of the second amplifier in a voltage following manner, and
- wherein the output terminal of the third amplifier is connected to the non-inverting input terminal of the second amplifier, a non-inverting input terminal of the third amplifier is connected to the reference line and an inverting input terminal of the third amplifier is connected to the output terminal of the third amplifier in a voltage following manner.

4. The OLED display device according to claim 1, wherein the data driver is configured to drive the pixel for a plurality of frames,
- wherein each frame of the plurality of frames includes:
- a scan period during which the first and second switching TFTs are turned on and a target driving voltage corresponding to the data voltage (Vdata) is charged in the capacitor, and
- a light-emitting period during which the first and second switching TFTs are turned off and the driving TFT drives the OLED element with the target driving voltage charged in the capacitor,
- wherein the scan period includes an initialization period, a sensing period, and a sampling period,
- wherein, during the initialization period, the first amplifier supplies the reference voltage (Vref) to the gate electrode of the driving TFT via the data line and the first switching TFT, and the second amplifier supplies the initialization voltage to the source electrode of the driving TFT via the reference line and the second switching TFT,
- wherein, during the sensing period, the first amplifier supplies the reference voltage (Vref) to the gate electrode of the driving TFT via the data line and the first switching TFT, the second amplifier enters a high impedance state, and a threshold voltage-reduced reference voltage (Vref−Vth) is charged in the source electrode of the driving TFT and the reference line by driving of the driving TFT, and
- wherein, during the sampling period, the first amplifier supplies the data voltage (Vdata) to the gate electrode of the driving TFT via the data line and the first switching TFT, the third amplifier senses the threshold voltage-reduced reference voltage (Vref−Vth) as the reference sensing voltage and supplies the reference sensing voltage to the second amplifier, the second amplifier supplies the reference sensing voltage supplied from the third amplifier to the source electrode of the driving TFT via the reference line and the second switching TFT, and the capacitor stores a difference voltage (Vdata−(Vref−Vth)) between the data voltage (Vdata) and the reference sensing voltage (Vref−Vth) as the target driving voltage.

5. The OLED display device according to claim 4, wherein the initialization voltage is less than the reference voltage (Vref) minus the threshold voltage (Vth) of the driving TFT to drive the driving TFT by a stored voltage in the capacitor of the reference voltage (Vref) minus the initialization voltage during the initialization period, and wherein the initialization voltage is less than a threshold voltage of the OLED element to cause the OLED element not to emit light during the initialization period and the sensing period.

6. The OLED display device according to claim 5, wherein, during the initialization period, the third amplifier enters a high impedance state, and wherein, during the sensing period, the third amplifier enters the high impedance state or performs a normal buffering operation.

7. The OLED display device according to claim 1, wherein a threshold voltage of the OLED element is greater than the reference voltage (Vref) minus the initialization voltage, and the reference voltage (Vref) minus the initialization voltage is greater than the threshold voltage (Vth) of the driving TFT.

8. The OLED display device according to claim 1, wherein the first and second gate lines are different gate lines or the same gate line.

9. An organic light-emitting diode (OLED) display device, comprising:

a pixel circuit including:

a driving thin film transistor (TFT) connected to an OLED element;

a first switching TFT configured to connect a data line to a gate electrode of the driving TFT;

a second switching TFT configured to connect a reference line to a source electrode of the driving TFT; and a capacitor connected between the gate electrode of the driving TFT and the source electrode of the driving TFT; and a data driver including an analog compensation circuit for compensating for a threshold voltage of the driving TFT, wherein the analog compensation circuit includes a first amplifier and a second amplifier, wherein the first amplifier is connected to an output of the second amplifier, and wherein the second amplifier is configured to sense a voltage of the reference line and supply a reference sensing voltage to the second amplifier, and the first amplifier is configured to supply a compensation voltage based on the reference sensing voltage to the reference line.

10. The OLED display device according to claim 9, wherein an output terminal of the first amplifier is connected to the reference line, a non-inverting input terminal of the first amplifier is connected to the output terminal of the second amplifier and an inverting input terminal of the first amplifier is connected to the output terminal of the first amplifier in a voltage following manner, and wherein the output terminal of the second amplifier is connected to the non-inverting input terminal of the first amplifier, a non-inverting input terminal of the second amplifier is connected to the reference line and an inverting input terminal of the second amplifier is connected to the output terminal of the second amplifier in a voltage following manner.

11. The OLED display device according to claim 9, wherein the reference sensing voltage is set to a reference voltage (Vref) supplied to the gate electrode of the driving TFT minus a threshold voltage (Vth) of the driving TFT.

12. The OLED display device according to claim 9, further comprising a third amplifier configured to drive the data line with a reference voltage (Vref) or a data voltage (Vdata).

* * * * *